United States Patent
Lee et al.

(10) Patent No.: US 11,411,300 B2
(45) Date of Patent: Aug. 9, 2022

(54) ELECTRONIC DEVICE COMPRISING PLURALITY OF ANTENNAS

(71) Applicant: Samsung Electronics Co., Ltd., Gyeonggi-do (KR)

(72) Inventors: Jonghyuck Lee, Gyeonggi-do (KR); Haeyeon Kim, Gyeonggi-do (KR); Sehyun Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/272,985

(22) PCT Filed: Sep. 27, 2019

(86) PCT No.: PCT/KR2019/012569
§ 371 (c)(1),
(2) Date: Mar. 3, 2021

(87) PCT Pub. No.: WO2020/067755
PCT Pub. Date: Apr. 2, 2020

(65) Prior Publication Data
US 2022/0052437 A1    Feb. 17, 2022

(30) Foreign Application Priority Data
Sep. 28, 2018  (KR) .................. 10-2018-0116110

(51) Int. Cl.
*H01Q 1/24*  (2006.01)
*H04B 1/40*  (2015.01)

(52) U.S. Cl.
CPC .............. *H01Q 1/243* (2013.01); *H04B 1/40* (2013.01)

(58) Field of Classification Search
CPC ........... H01Q 1/24; H01Q 1/243; H04M 1/02; H04B 1/40
See application file for complete search history.

(56) References Cited

U.S. PATENT DOCUMENTS

2016/0209513 A1    7/2016  Hirahama et al.
2017/0047638 A1*   2/2017  Kim ................... H01Q 21/28
(Continued)

FOREIGN PATENT DOCUMENTS

CN    107425258 A    12/2017
JP    2009-188714 A   8/2009
(Continued)

*Primary Examiner* — Nguyen T Vo
(74) *Attorney, Agent, or Firm* — Cha & Reiter, LLC

(57) ABSTRACT

An electronic device according to various embodiments of the present invention can comprise: a housing comprising a front plate, a rear plate which faces the opposite direction from the front plate, and a lateral bezel structure which surrounds a space between the front plate and rear plate, and the side bezel structure comprises a first conductive part, a second conductive part and a first insulating part formed between the first conductive part and second conductive part; a printed circuit board which is disposed inside the housing and comprises at least one ground layer electrically connected in a first position of the first conductive part adjacent to the first insulating part; a first conductive pattern which is electrically connected in a second position of the first conductive part further away from the first insulating part than the first position, and is disposed between the first position and second position when seen from the outside of the lateral bezel structure; a first wireless communication circuit which is electrically connected in a second position and transmits and receives a first signal having a first frequency, and is electrically connected in a third position of the second conductive part and transmits and receives a second signal having a second frequency; a second conductive pattern which is disposed between the second position and third position when seen from the outside of a lateral member, and is electrically connected to the ground layer; and a second wireless communication circuit which is electrically connected in the second position and receives a (Continued)

third signal having a third frequency, and is electrically connected in the third position and receives a fourth signal having a fourth frequency. Various other embodiments may be possible.

15 Claims, 10 Drawing Sheets

(56) References Cited

U.S. PATENT DOCUMENTS

| | | |
|---|---|---|
| 2017/0047641 A1* | 2/2017 | Kim ..................... H01Q 1/243 |
| 2017/0048363 A1* | 2/2017 | Lee ..................... H04B 1/3833 |
| 2017/0201010 A1 | 7/2017 | Kim et al. |
| 2017/0338545 A1 | 11/2017 | Guo |
| 2018/0026332 A1 | 1/2018 | Lin et al. |
| 2018/0375193 A1 | 12/2018 | Zhang et al. |

FOREIGN PATENT DOCUMENTS

| | | |
|---|---|---|
| JP | 2015-070302 A | 4/2015 |
| KR | 10-0895886 B1 | 4/2009 |
| KR | 10-2017-0080412 A | 7/2017 |
| KR | 10-2017-0084632 A | 7/2017 |

* cited by examiner

ELECTRONIC DEVICE COMPRISING PLURALITY OF ANTENNAS

CROSS-REFERENCE TO RELATED APPLICATION(S)

This application is a National Phase Entry of PCT International Application No. PCT/KR2019/012569, which was filed on Sep. 27, 2019 and claims priority to Korean Patent Application No. 10-2018-0116110, which was filed on Sep. 28, 2018 in the Korean Intellectual Property Office, the contents of which are incorporated herein by reference.

1. FIELD

Various embodiments relate to an electronic device, and, more particularly, to an electronic device including a plurality of antennas.

2. DESCRIPTION OF THE RELATED ART

As electronic, information, and communication technologies have developed, various functions have come to be integrated into a single electronic device. For example, a smartphone includes functions of an audio reproduction device, an imaging device, or a digital diary, in addition to a communication function, and a greater variety of functions may be implemented in the smartphone through installation of additional applications. An electronic device may be provided with various pieces of information in real time by accessing a server or another electronic device in a wired or wireless manner as well as by executing an installed application or a stored file. For example, an application or a stored information file may be directly transmitted/received between electronic devices or between an electronic device and a server without passing through a storage medium.

Recently, an environment in which not only data but also charging power is wirelessly transmitted and received has been provided, and electronic devices may be equipped with a larger number of and more various types of antennas so as to enhance user convenience. For example, an electronic device may be provided with antennas for two-way communication such as commercial communication network access, wireless local area network (w-LAN), and near field communication (NFC), a broadcasting reception antenna, an earth satellite navigation system (GNSS) antenna, or a wireless power reception antenna.

SUMMARY

Meanwhile, in an electronic device that a user carries and uses, such as a mobile communication terminal, it may be difficult to arrange various types of antennas, for example, radiating conductors. For example, each antenna may have a certain electrical or physical length depending on the operating frequency, and a sufficient distance from other antennas may be required in order to avoid electromagnetic interference. However, in a miniaturized electronic device, for example, in an electronic device that a user carries and uses, it may be difficult to secure the size of an antenna or a distance of the antenna from another antenna. Moreover, when the difference between operating frequencies formed by two adjacent antennas, e.g., the radiating conductors, is not large, e.g., the difference between the operating frequencies is only about several hundred MHz, the electromagnetic interference between these two antennas may be greater.

Various embodiments of the disclosure may provide an antenna capable of performing stable wireless communication while securing operating frequencies in multiple different frequency bands, or an electronic device including the same.

Various embodiments of the disclosure may provide an antenna, which, while radiating conductors thereof are arranged adjacent to each other, suppresses electromagnetic interference while securing operating frequencies in multiple different frequency bands, or an electronic device including the same.

Various embodiments of the disclosure may provide an antenna capable of improving wireless communication performance by securing operating frequencies in multiple frequency bands, or an electronic device including the same.

According to various embodiments of the disclosure, an electronic device may include: a housing including a front plate, a rear plate facing away from the front plate, and a side bezel structure surrounding a space between the front plate and rear plate, and the side bezel structure including a first conductive portion, a second conductive portion, and a first insulative portion disposed between the first conductive portion and second conductive portion; a printed circuit board disposed inside the housing and including at least one ground layer electrically connected to a first position of the first conductive portion adjacent to the first insulative portion; a first conductive pattern electrically connected to a second position of the first conductive portion spaced further away from the first insulative portion than the first position and disposed between the first position and the second position when viewed from an outside of the side bezel structure; a first wireless communication circuit electrically connected to the second position so as to transmit and receive a first signal having a first frequency and electrically connected to a third position of the second conductive portion so as to transmit and receive a second signal having a second frequency; a second conductive pattern disposed between the second position and the third position when viewed from the outside of the side bezel structure and electrically connected to the ground layer; and a second wireless communication circuit electrically connected to the second position so as to receive a third signal having a third frequency and electrically connected to the third position so as to receive a fourth signal having a fourth frequency.

According to various embodiments of the disclosure, an electronic device may include: a housing including a side bezel structure at least partially formed of an electrically conductive material; a first antenna including a first conductive portion made of a conductive material in the side bezel structure, and a first conductive pattern disposed in an inner space of the housing; a second antenna including a second conductive portion made of a conductive material in the side bezel structure; a second conductive pattern disposed in the inner space of the housing and forming a capacitive coupling with the first conductive portion or the first conductive pattern; and a processor or communication module electrically connected to the first antenna and the second antenna. The processor or the communication module may receive at least global positioning system (GPS) information using at least one of the first antenna and the second antenna.

According to various embodiments of the disclosure, an electronic device is capable of securing operating frequencies in multiple different frequency bands using a conductive material part of the housing. In an embodiment, since stable wireless communication can be performed while one antenna and a conductive pattern provided as a part of another antenna are arranged adjacent to each other, it may be easy to mount the antenna in a miniaturized electronic device.

DETAILED DESCRIPTION

Figure 1:
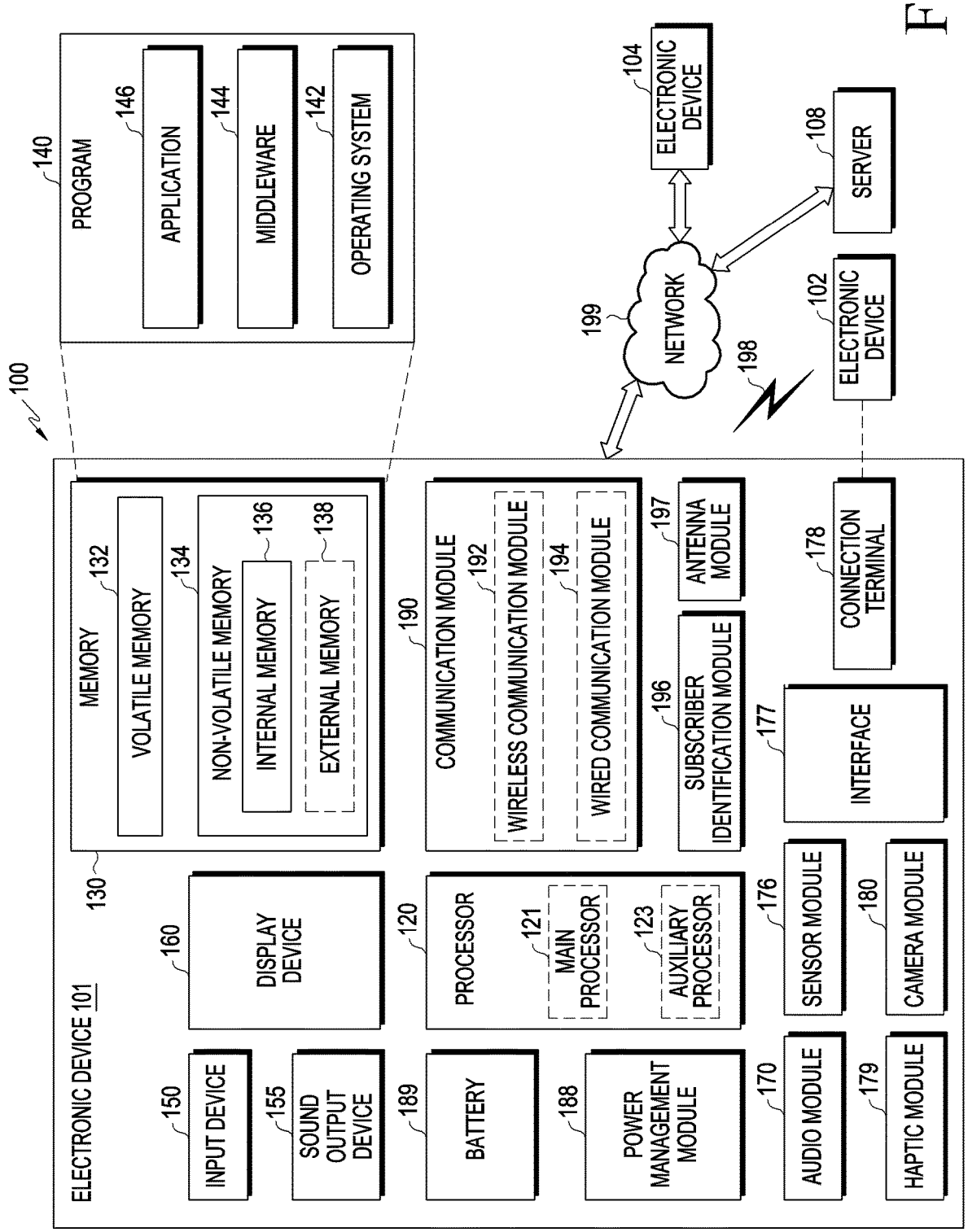
FIG. 1 is a block diagram illustrating an electronic device according to various embodiments of the disclosure within a network environment.

As the disclosure allows for various changes and numerous embodiments, some exemplary embodiments will be described in detail with reference to the accompanying drawings. However, it should be understood that the disclosure is not limited to the specific embodiments, but the disclosure includes all modifications, equivalents, and alternatives within the spirit and the scope of the disclosure.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Although ordinal terms such as "first" and "second" may be used to describe various elements, these elements are not limited by the terms. The terms are used merely for the purpose to distinguish an element from the other elements. For example, a first element could be termed a second element, and similarly, a second element could be also termed a first element without departing from the scope of the disclosure. As used herein, the term "and/or" includes any and all combinations of one or more associated items. It is to be understood that if an element (e.g., a first element) is referred to, with or without the term "operatively" or "communicatively", as "coupled with," or "connected with,", it means that the element may be coupled with the other element directly (e.g., wiredly), wirelessly, or via a third element.

Further, the relative terms "a front surface", "a rear surface", "a top surface", "a bottom surface", and the like which are described with respect to the orientation in the drawings may be replaced by ordinal numbers such as first and second. In the ordinal numbers such as first and second, their order are determined in the mentioned order or arbitrarily and may not be arbitrarily changed if necessary.

In the disclosure, the terms are used to describe specific embodiments, and are not intended to limit the disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the disclosure belongs. Such terms as those defined in a generally used dictionary are to be interpreted to have the meanings equal to the contextual meanings in the relevant field of art, and are not to be interpreted to have ideal or excessively formal meanings unless clearly defined in the specification.

In the disclosure, an electronic device may be a random device, and the electronic device may be called a terminal, a portable terminal, a mobile terminal, a communication terminal, a portable communication terminal, a portable mobile terminal, a touch screen, or the like.

For example, the electronic device may be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device may be implemented as a portable communication terminal which has a wireless communication function and a pocket size. Further, the electronic device may be a flexible device or a flexible display device.

The electronic device may communicate with an external electronic device, such as a server or the like, or perform an operation through an interworking with the external electronic device. For example, the electronic device may transmit an image photographed by a camera and/or position information detected by a sensor unit to the server through a network. The network may be a mobile or cellular communication network, a Local Area Network (LAN), a Wireless Local Area Network (WLAN), a Wide Area Network (WAN), an Internet, a Small Area Network (SAN) or the like, but is not limited thereto.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record or as a dedicated speaker for call receiving, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimediainterface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include a plurality of antennas. In such a case, at least one antenna appropriate for a communication scheme used in the communication network, such as the first network 198 or the second network 199, may be selected, for example, by the communication module 190. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

As used herein, the term "module" may include a unit configured in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be configured in an application-specific integrated circuit (ASIC).

Figure 2:
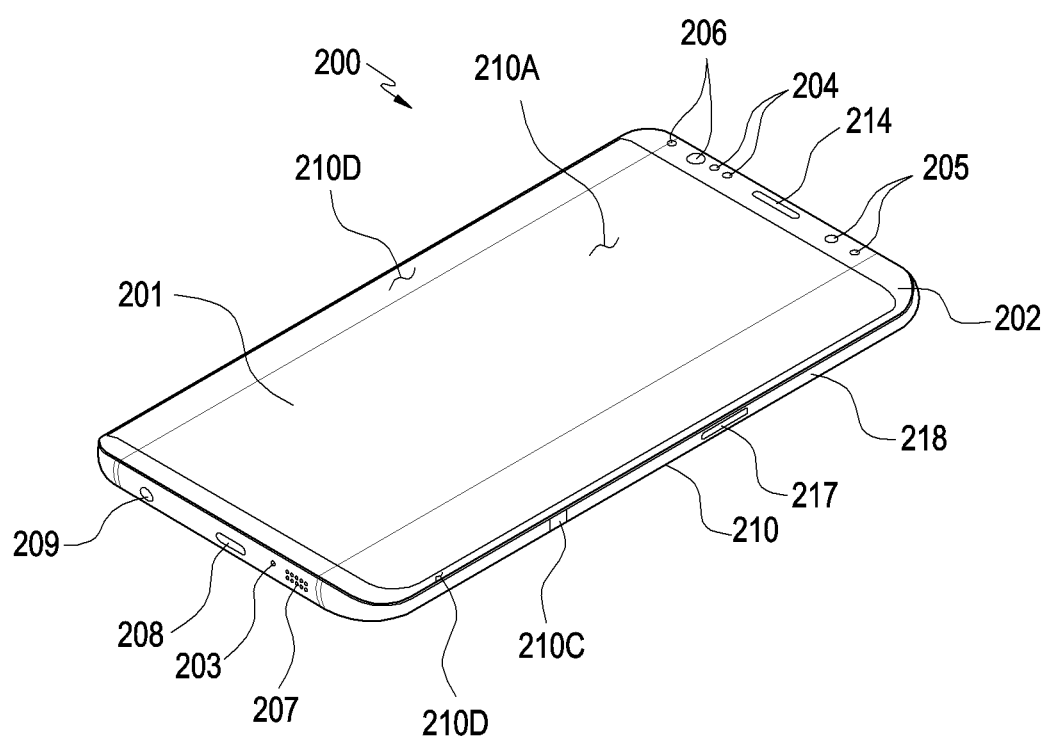
FIG. 2 is a perspective view illustrating the rear side of an electronic device according to various embodiments.
Figure 3:
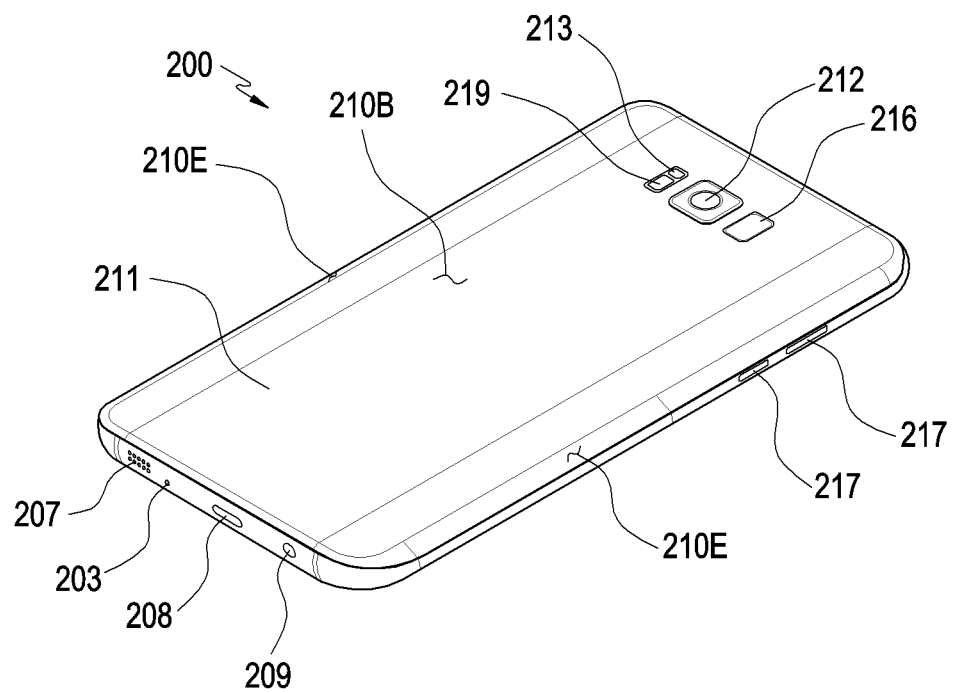
FIG. 3 is a perspective view illustrating the rear side of the electronic device illustrated in FIG. 2.

FIG. 2 is a perspective view illustrating the front side of an electronic device 200 according to various embodiments. FIG. 3 is a perspective view illustrating the rear side of the electronic device 200 illustrated in FIG. 2.

Referring to FIGS. 2 and 3, according to an embodiment, the electronic device 200 may include a housing 210 including a first surface (or a front surface) 210A, a second surface (or a rear surface) 210B, and a side surface 210C surrounding the space between the first surface 210A and the second surface 210B. In another embodiment (not illustrated), the term "housing" may refer to a structure forming some of the first surface 210A, the second surface 210B, and the side surface 210C of FIG. 2. According to an embodiment, at least a portion of the first surface 210A may be formed by a substantially transparent front plate 202 (e.g., a glass plate or a polymer plate including various coating layers). In another embodiment, the front plate 202 may be coupled to the housing 210 so as to form an inner space with the housing 210. Here, the term "inner space" may mean the space between the front plate 202 and a first support member (e.g., the first support member 411 in FIG. 4) to be described later. In various embodiments, the term "inner space" may mean the inner space of the housing 210 that accommodates at least a portion of a display 201 to be described later or the display 430 in FIG. 4.

According to various embodiments, the second surface 210B may be formed by a substantially opaque rear plate 211. The rear plate 211 may be made of, for example, coated or colored glass, ceramic, a polymer, a metal (e.g., aluminum, stainless steel (STS), or magnesium), or a combination of two or more of these materials. The side surface 210C may be provided by a side bezel structure (or a "side member") 218 coupled to the front plate 202 and the rear plate 211 and including a metal and/or a polymer. In various embodiments, the rear plate 211 and the side bezel structure 218 may be integrally formed, and may include the same material (e.g., a metal material such as aluminum).

In the illustrated embodiment, the front plate 202 may include, at the long opposite side edges thereof, two first areas 210D (e.g., the curved portions R in FIG. 4), which are bent from the first surface 210A toward the rear plate 211 and extend seamlessly. In the illustrated embodiment (see FIG. 3), the rear plate 211 may include, at the long opposite side edges thereof, two second areas 210E, which are bent from the second face 210B towards the front plate 202 and extend seamlessly. In various embodiments, the front plate 202 (or the rear plate 211) may include only one of the first areas 210D (or the second areas 210E). In another embodiment, some of the first areas 210D or the second areas 210E may not be included. In the above embodiments, when viewed from a side of the electronic device 200, the side bezel structure 218 may have a first thickness (or width) on the side surface in which the first areas 210D or the second areas 210E are not included (e.g., the side surface in which the connector hole 208 is disposed), and may have a second thickness, which is smaller than the first thickness, on the side surface in which the first areas 210D or the second areas 210E are included (e.g., the side surfaces in which the key input devices 217 are disposed).

According to an embodiment, the electronic device 200 may include at least one of a display 201, audio modules 203, 207, and 214, sensor modules 204, 216, and 219, camera modules 205, 212, and 213, key input devices 217, light-emitting elements 206, and connector holes 208 and 209. In various embodiments, at least one of the components (e.g., the key input devices 217 or the light-emitting elements 206) may be omitted from the electronic device 200, or the electronic device 100 may additionally include other components.

The display 201 may be exposed through, for example, a considerable portion of the front plate 202. In various embodiments, at least a portion of the display 201 may be exposed through the front plate 202 forming the first surface 210A and the first areas 210D of the side surfaces 210C. In various embodiments, the edges of the display 201 may be formed to be substantially the same as the shape of the periphery of the front plate 202 adjacent thereto. In another embodiment (not illustrated), the distance between the periphery of the display 201 and the periphery of the front plate 202 may be substantially constant in order to enlarge the exposed area of the display 201.

In another embodiment (not illustrated), recesses or openings may be formed in a portion of a screen display area (e.g., an active area) or an area (e.g., a non-active area) out of the screen display area of the display 201, and at least one of the audio module 214, the sensor modules 204, the camera modules 205, and the light-emitting elements 206, which are aligned with the recesses or the openings, may be included. In another embodiment (not illustrated), the rear surface of the screen display area of the display 201 may include at least one of the audio modules 214, the sensor modules 204, the camera modules 205, the fingerprint sensor 216, and the light-emitting elements 206. In another embodiment (not illustrated), the display 201 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 204 and 219 and/or at least some of the key input devices 217 may be disposed in the first areas 210D and/or the second areas 210E.

The audio modules 203, 207, and 214 may include a microphone hole 203 and speaker holes 207 and 214. The microphone hole 203 may include a microphone disposed therein so as to acquire external sound, and in various embodiments, multiple microphones may be disposed therein so as to detect the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker (e.g., a piezo speaker) may be included without the speaker holes 207 and 214.

The sensor modules 204, 216, and 219 may generate electrical signals or data values corresponding to the internal operating state or the external environmental state of the electronic device 200. The sensor modules 204, 216, and 219 may include, for example, a first sensor module 204 (e.g., a proximity sensor), a second sensor module (not illustrated) (e.g., a fingerprint sensor) disposed on the first surface 210A of the housing 210, a third sensor module 219 (e.g., an HRM sensor), and/or a fourth sensor module 216 (e.g., a fingerprint sensor) disposed on the second surface 210B of the housing 210. The fingerprint sensor may be disposed not only on the first surface 210A (e.g., the display 201) of the housing 210, but also on the second surface 210B. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212, and 213 may include a first camera device 205 disposed on the first surface 210A of the electronic device 200, and a second camera device 212 and/or a flash 213 disposed on the second surface 210B. The camera modules 205 and 212 may include one or more lenses, an image sensor, and/or an image signal processor. The flash 213 may include, for example, a light-emitting diode or a xenon lamp. In various embodiments, two or more lenses (e.g., an infrared camera lens, a wide-angle lens, and a telephoto lens) and image sensors may be disposed on one surface of the electronic device 200.

The key input devices 217 may be disposed on the side surface 210C of the housing 210. In another embodiment, the electronic device 200 may not include some or all of the above-mentioned key input devices 217, and a key input device 217, which is not included therein, may be implemented in another form of a soft key or the like on the display 201. In some embodiments, the key input devices may include a sensor module 216 disposed on the second surface 210B of the housing 210.

The light-emitting elements 206 may be disposed, for example, on the first surface 210A of the housing 210. The light-emitting elements 206 may provide, for example, information about the state of the electronic device 200 in an optical form. In another embodiment, the light-emitting elements 206 may provide a light source that is interlocked with, for example, the operation of the camera modules 205. The light-emitting elements 206 may include, for example, an LED, an IR LED, and a xenon lamp.

The connector holes 208 and 209 may include a first connector hole 208, which is capable of accommodating a connector (e.g., a USB connector) for transmitting/receiving power and/or data to/from an external electronic device, and/or a second connector hole 209, which is capable of accommodating a connector (e.g., an earphone jack) for transmitting/receiving an audio signal to/from an external electronic device.

Figure 4:
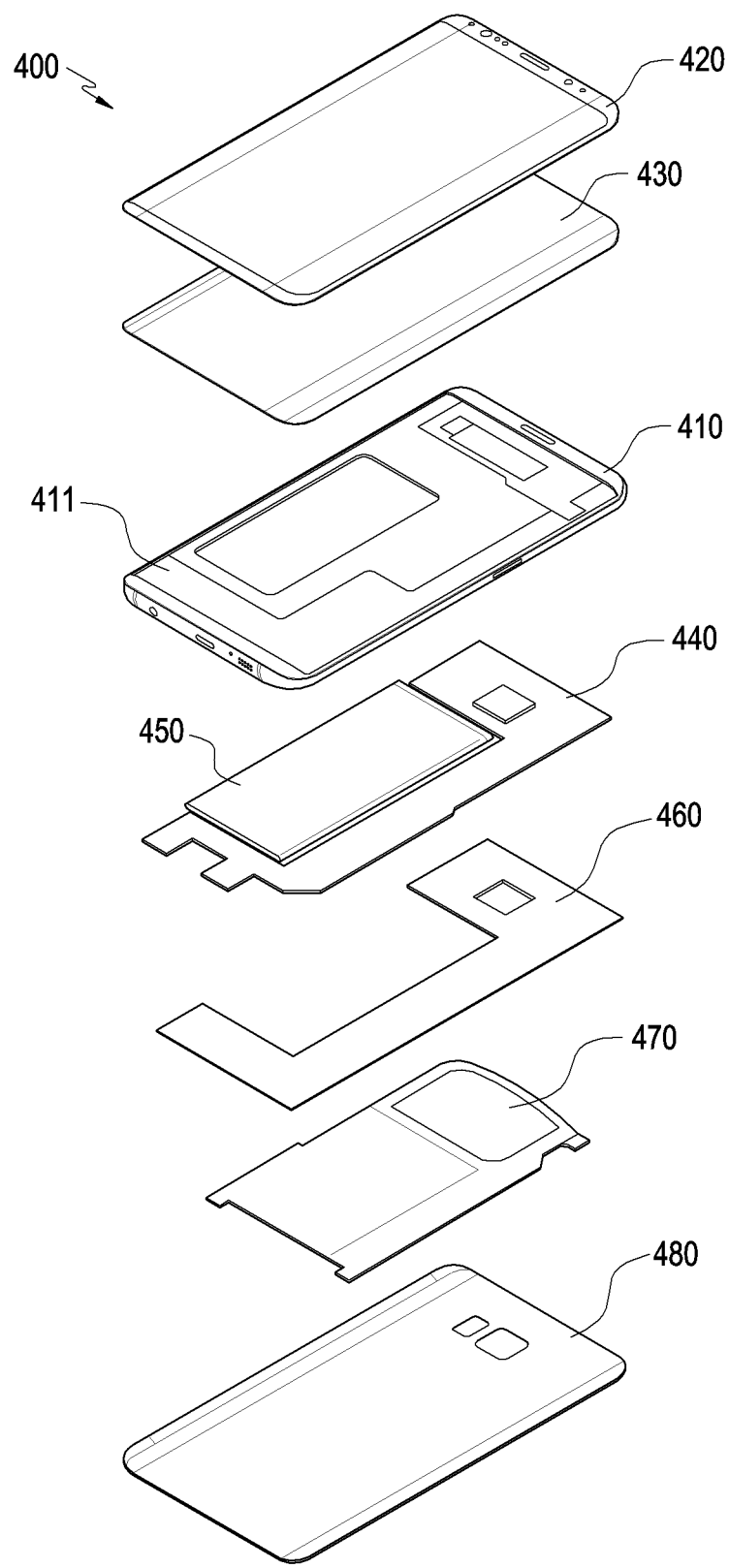
FIG. 4 is an exploded perspective view illustrating the electronic device illustrated in FIG. 2.

FIG. 4 is an exploded perspective view illustrating the electronic device illustrated in FIG. 2.

Referring to FIG. 4, an electronic device 400 may include a side bezel structure 410, a first support member 411 (e.g., a bracket), a front plate 420, a display 430, a printed circuit board 440, a battery 450, a second support member 460 (e.g., a rear case), an antenna 470, and a rear plate 480. In various embodiments, in the electronic device 400, at least one of the components (e.g., the first support member 411 or the second support member 460) may be omitted, or other components may be additionally included. At least one of the components of the electronic device 400 may be the same as or similar to at least one of the components of the electronic device 200 of FIG. 2 or 3, and a redundant description thereof is omitted below.

The first support member 411 may be disposed inside the electronic device 400, and may be connected to the side bezel structure 410 or may be integrated with the side bezel structure 410. The first support member 411 may be formed of, for example, a metal material and/or a non-metal material (e.g., a polymer). The display 430 may be coupled to one surface of the first support member 411, and the printed circuit board 440 may be coupled to the other surface of the first support member 411. On the printed circuit board 440, a processor, a memory, and/or an interface may be mounted. The processor may include at least one of, for example, a central processing unit, an application processor, a graphics processor, an image signal processor, a sensor hub processor, or a communication processor.

Substantially the entire area of the display 430 may be attached to the inner surface of the front plate 420, and an opaque layer may be disposed in the periphery of or around the area in which the display 430 is attached on the inner surface of the front plate 420. In the area of the front plate 420 in which the display 430 is not disposed, such an opaque layer may block the exposure of a portion of an inner structure (e.g., the first support member 411) of the electronic device 400 to the outside.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 400 to an external electronic device, and may include a USB connector, an SD card/MMC connector, or an audio connector.

The battery 450 is a device for supplying power to at least one component of the electronic device 400, and may include, for example, a non-rechargeable primary battery, a rechargeable secondary battery, or a fuel cell. At least a portion of the battery 450 may be disposed on substantially the same plane as, for example, the printed circuit board 440. The battery 450 may be integrally disposed inside the electronic device 400, or may be detachably disposed on the electronic device 400.

The antenna 470 may be disposed between the rear plate 480 and the battery 450. The antenna 470 may include, for example, a near field communication (NFC) antenna, a wireless charging antenna, and/or a magnetic secure transmission (MST) antenna. The antenna 470 is capable of, for example, performing short-range communication with an external device or transmitting/receiving power required for charging to/from an external device in a wireless manner. In another embodiment, an antenna structure may be formed by the side bezel structure 410 and/or a portion of the first support member 411, or a combination thereof.

Hereinafter, antennas according to various embodiments of the disclosure will be described with reference to FIGS. 5 to 15. In describing the antennas according to various embodiments of the disclosure, the electronic devices 100, 200, and 400 of FIGS. 1 to 4 may be further referred to as necessary. For a configuration that can be easily understood based on a configuration of a preceding embodiment, the same reference numerals may be assigned or omitted, and a detailed description thereof may also be omitted.

Figure 5:
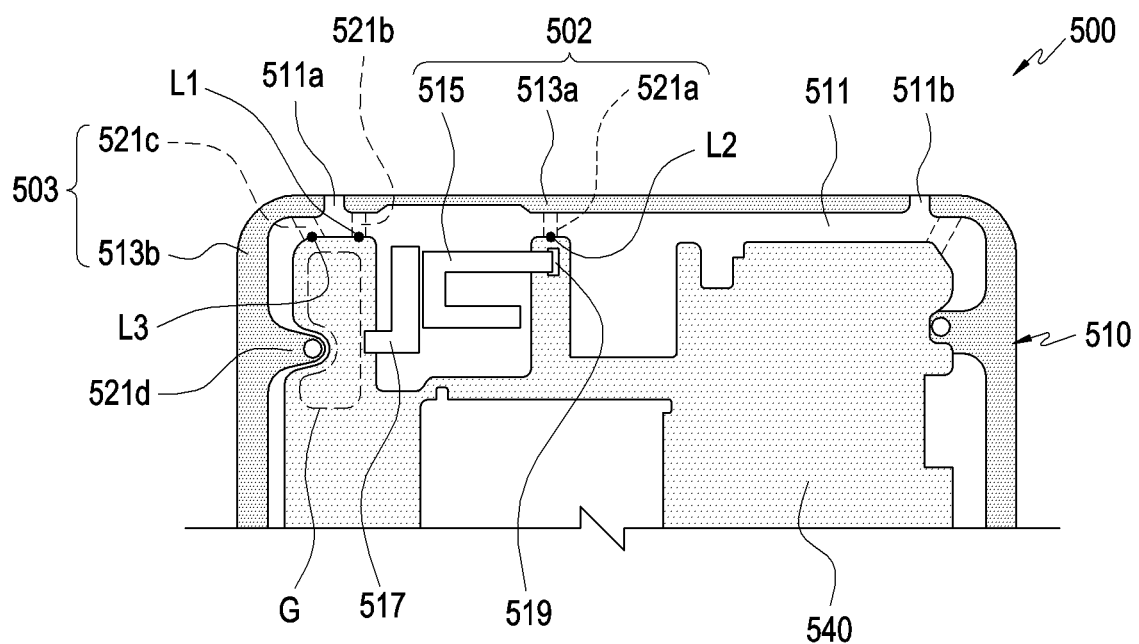
FIG. 5 is a view for describing an arrangement of antennas in an electronic device according to various embodiments of the disclosure.
Figure 6:
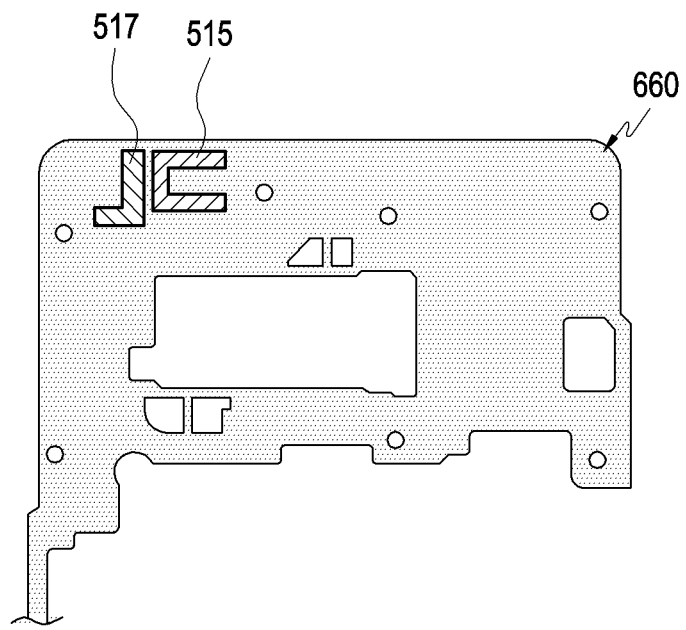
FIG. 6 is a view illustrating a configuration on which conductive patterns are disposed in an electronic device according to various embodiments of the disclosure.

FIG. 5 is a plan view for describing an arrangement of antennas 502 and 503 in an electronic device 500 according to various embodiments of the disclosure. FIG. 6 is a view illustrating the configuration in which conductive patterns 515 and 517 are provided in the electronic device 500 according to various embodiments of the disclosure.

Referring to FIGS. 5 and 6, each of a first antenna 502 and a second antenna 503 may include at least a portion of a side bezel structure 510 (e.g., the side bezel structure 410 in FIG. 4) of the electronic device 500 (e.g., the electronic device 400 of FIG. 4) as a radiating conductor. According to an embodiment, the side bezel structure 510 may include a portion made of a conductive material or a portion made of a non-conductive material. For example, the first support member 511 (e.g., the first support member 411 in FIG. 4) may be at least partially made of a non-conductive material while being configured integrally with the side bezel structure 510. The side bezel structure 510 may include insulative portions configured integrally with a non-conductive material portion of the first support member 411, for example, insulating members 511a and 511b.

According to various embodiments, among the conductive material portions of the side bezel structure 510, a first conductive portion 513a may be provided as a portion of a radiating conductor of the first antenna 502. In an embodiment, the first conductive portion 513a may substantially configure a portion of the exterior of the electronic device 500 (e.g., at least a portion of the upper end of the electronic device 500). In an embodiment, the insulating members 511a and 511b may be disposed at opposite ends of the first conductive portion 513a so as to provide an insulating structure between the first conductive portion 513a and another conductive material portion of the side bezel structure 510 (e.g., the second conductive portion 513b).

Figure 16:
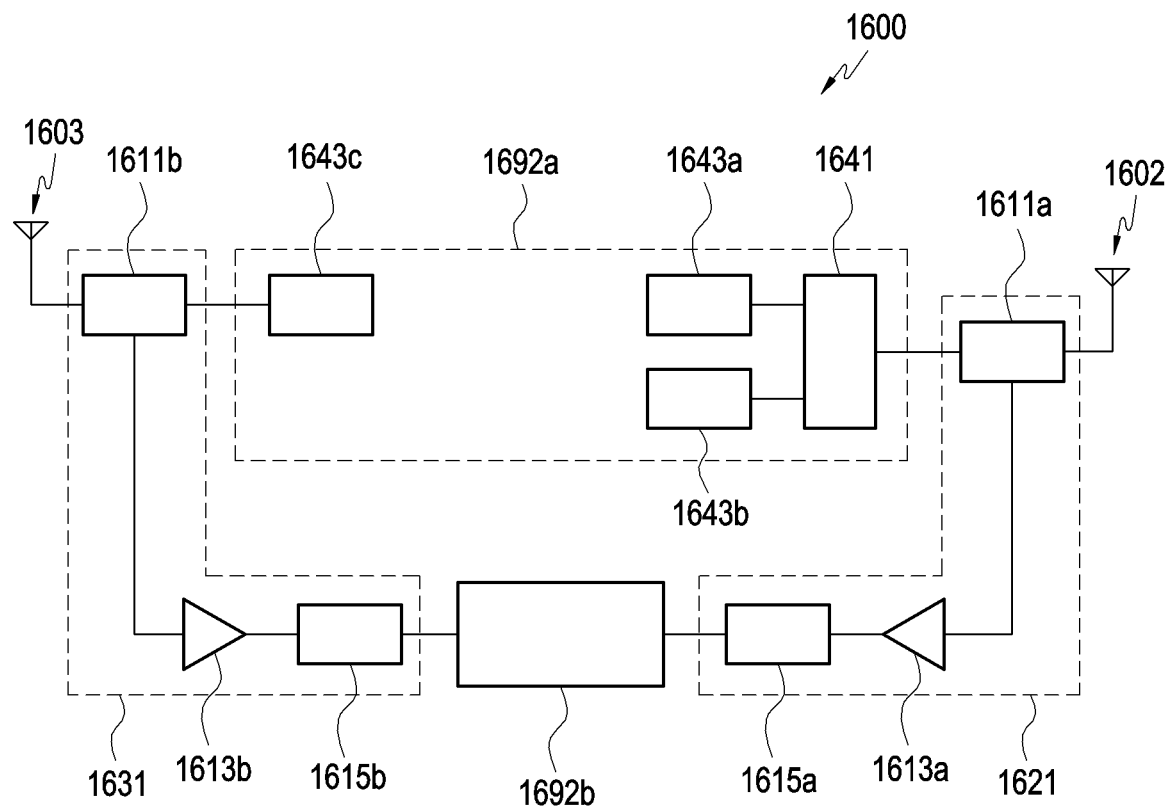
FIG. 16 is a block diagram illustrating an antenna system of an electronic device according to various embodiments of the disclosure.

According to various embodiments, the first conductive portion 513a may be electrically connected to a ground layer G at a first position L1 adjacent to the first insulating member 511a, and may be electrically connected to a communication module (e.g., the first or second wireless communication circuit 1692a or 1692b in FIG. 16) at a second position L2 located further away from the first insulating member 511a than the first position L1. In an embodiment, the first antenna 502 may include a first power-feeding pin 521a and a first shorting pin 521b extending from the inner surface of the first conductive portion 513a. The first power-feeding pin 521a may protrude from the second position L2 into the inner space of the housing, and the first shorting pin 521b may protrude from the first position L1 into the inner space of the housing. Here, the term "inner space of the housing" may mean the space between the front plate 420 and the rear plate 480 in FIG. 4, which is surrounded by the side bezel structure 510. In an embodiment, the first shorting pin 521b and the first power supply pin 521a may electrically connect the first conductive portion 513a to the ground layer G or the communication module.

According to various embodiments, the first antenna 502 may include a first conductive pattern 515. In an embodiment, the first conductive pattern 515 may be configured on the second support member 660 (e.g., the second support member 460 in FIG. 4). The first conductive pattern 515 may include, for example, a conductive pattern formed by processing the surface of the second support member 660 of a non-conductive material using laser, i.e., through laser direct structuring (LDS). In an embodiment, the second support member 660 may be disposed in the inner space of the housing in the state in which one surface thereof faces one surface of the circuit board 540 (e.g., the printed circuit board 440 in FIG. 4). It is noted that the second support member 660 is omitted in FIG. 5 in order to indicate the position of the first conductive pattern 515.

According to various embodiments, when the second support member 660 is coupled to the side bezel structure 510, the first conductive pattern 515 may form a branched structure with the first conductive portion 513a or the first power-feeding pin 521a. According to an embodiment, when viewed from the outside of the side bezel structure 510, for example, when viewed from the side of the electronic device 400 of FIG. 4, the first conductive pattern 515 may be disposed between the first position L1 (e.g., the first shorting pin 521b) and the second position L2 (e.g., the first power-feeding pin 521a).

According to various embodiments, the first conductive pattern 515 may form an electrically branched structure with the first power-feeding pin 521a. For example, the first conductive pattern 515 may be electrically connected to the first conductive portion 513a so as to form another portion of the first antenna 502. In some embodiments, a contact member 519 (e.g., a C-clip) may be provided on the circuit board 540 so as to electrically connect the first conductive pattern 515 to the circuit board 540. For example, a communication module (e.g., the communication module 190 in FIG. 1 or the first and second wireless communication circuits 1692a and 1692b in FIG. 16) may be provided on the circuit board 540 to be electrically connected to the first antenna 502.

According to various embodiments, the first power-feeding pin 521a and the first shorting pin 521b may be electrically connected to the circuit board 540 through another contact member (not illustrated). For example, the first power-feeding pin 521a may be electrically connected to a first power-feeding unit F1 in FIG. 7 to be described later or a communication module of the circuit board 540, and the first shorting pin 521b may be electrically connected to a ground layer G of the substrate 540 (e.g., the ground portion G in FIG. 7 to be described later).

According to various embodiments, the first conductive portion 513a may form a planar type inverted-F antenna (PIFA) structure, and the first conductive pattern 515 may be implemented in various shape such as an L shape, a U shape, an I shape, or a meander line shape. The first conductive pattern 515 may receive power in common with the first conductive portion 513a from a power-feeding unit (e.g., the first power-feeding unit F1 in FIG. 7) to radiate the first antenna 502 so as to act as a radiating conductor. According to an embodiment, when the first conductive pattern 515 is not disposed in the structure, the first antenna 502 may form an operating frequency in an about 800 MHz or 1.8 GHz band using the first conductive portion 513a. When the first conductive pattern 515 forms the radiating conductor of the first antenna 502 together with the first conductive portion 513a, the first antenna 502 may further form an operating frequency in an about 1.2 GHz band, in addition in the about 800 MHz or 1.8 GHz band. The numerical values for the bands of the operating frequency are described as an example, and may vary depending on specifications required for an actual product or depending on the size or shape of the manufactured first antenna 502.

According to various embodiments, the second conductive portion 513b of the side bezel structure 510 may be included in the radiating conductor of the second antenna 503 of the electronic device 500. In an embodiment, the second conductive portion 513b may substantially form at least a portion of the exterior of the electronic device 500. In another embodiment, the first insulating member 511a may be interposed between one end of the second conductive portion 513b and one end of the first conductive portion 513a.

According to various embodiments, the second antenna 503 may include a second power-feeding pin 521c and a second shorting pin 521d extending from the inner surface of the second conductive portion 513b. For example, the second power-feeding pin 521c and the second shorting pin 521d may protrude into the inner space of the housing. According to an embodiment, the second power-feeding pin 521c and the second shorting pin 521d may be electrically connected to the circuit board 540 through another contact member (not illustrated). For example, the second antenna 503 may be electrically connected to a communication module (e.g., the first or second communication circuit 1692a or 1692b in FIG. 16) via the second power-feeding pin 521c at a third position L3 adjacent to the first insulating member 511a. In another embodiment, the second shorting pin 521d may electrically connect the second conductive portion 513a to a ground layer G of the circuit board 540 (e.g., the ground portion G in FIG. 7) at a fourth position different form the third position L3. According to an embodiment, the second antenna 503 is fed with independent power independently from the first antenna 502, and may form an operating frequency in a frequency band different from that of the first antenna 502. For example, the second antenna 503 may form an operating frequency in an about 2.3 GHz band and in an about 1.5 GHz band.

According to various embodiments, a processor (e.g., the processor 120 in FIG. 1) or a communication module (e.g., the communication module 190 of FIG. 1 or the first and second wireless communication circuits 1692a and 1692b of FIG. 16) of the electronic device 500 may transmit and receive wireless signals using at least one of the first antenna 502 and the second antenna 503. According to an embodiment, the electronic device 500 may receive earth satellite navigation system (GNSS) signals using each of an operating frequency secured by arranging the first conductive pattern 515 on the first antenna 502 and an operating frequency formed by the second antenna 503. For example, an operating frequency of an about 1.2 GHz band or a 1.5 GHz band is a frequency band in which GNSS signals are transmitted and received, and the electronic device 500 may receive such GNSS signals in multiple frequency bands. In an embodiment, the earth satellite navigation system signal may include global positioning system (GPS) information.

According to various embodiments, the electronic device 500 may include a second conductive pattern 517 connected to a ground portion provided in the housing (e.g., a ground layer G (e.g., the ground portion G in FIG. 7)). In an embodiment, the second conductive pattern 517 may be formed by processing the surface of the second support member 660 using a laser. In the present embodiment, as the second conductive pattern 517, a structure on the same surface as the first conductive pattern 515 on the second support member 660 is illustrated. However, the disclosure is not limited thereto, and the second conductive pattern 517 may be configured on the second support member 660 on a surface different from that of the first conductive pattern 515.

According to various embodiments, when the second support member 660 is coupled to the side bezel structure 510, the second conductive pattern 517 may be disposed between the third position L3 (e.g., the second power-feeding pin 521c) and the second position L2 (e.g., the first power-feeding pin 521a) when viewed from the outside of the side bezel structure 510, for example, when viewed from the side of the electronic device 400 of FIG. 4. In an embodiment, the second conductive pattern 517 may form an electromagnetic isolation structure between the second antenna 503 and the first antenna 502 (e.g., the first conductive pattern 515). For example, the second conductive pattern 517 may improve an isolation characteristic by reducing electromagnetic interference between the second antenna 503 and the first antenna 502. The operating frequency (e.g., the operating frequency in the 1.2 GHz band) secured by the arrangement of the first conductive pattern 515 is has a difference of about several hundred MHz from the operating frequency of the second antenna 503 (e.g., the operating frequency in the 1.5 GHz band) of the second antenna 503. Thus, when the second antenna 503 and the first antenna 502 are disposed adjacent to each other, the transmission/reception efficiency in some operating frequency bands may be degraded due to electromagnetic interference. According to various embodiments of the disclosure, by including the second conductive pattern 517, the electronic device 500 is capable of securing a stable wireless communication environment even when the second antenna 503 and the first antenna 502 are disposed adjacent to each other. For example, since the second conductive pattern 517 is disposed, the electronic device 500 or an electronic device including the same (e.g., the electronic device 400 in FIG. 4) may be easily miniaturized.

Figure 7:
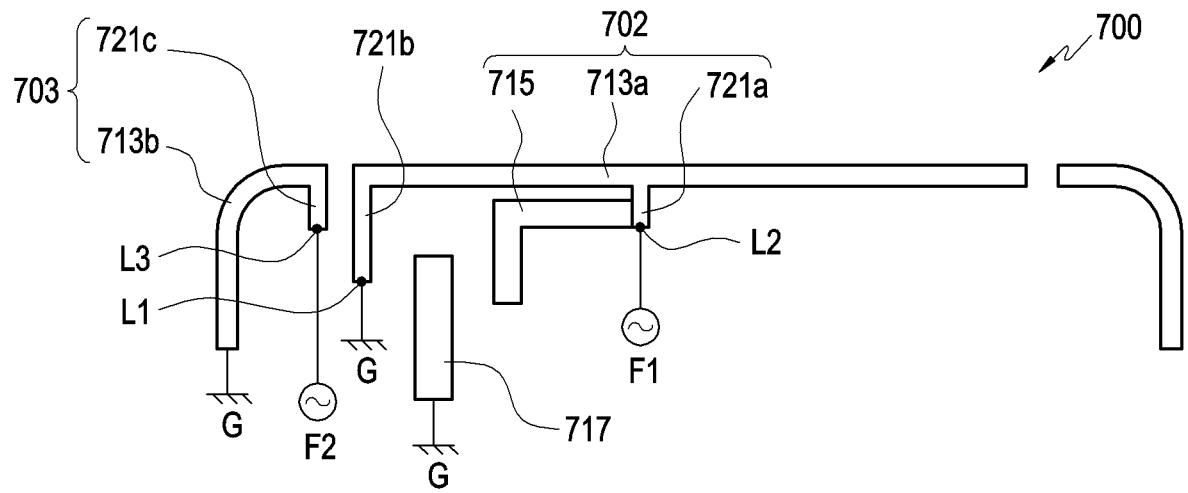
FIG. 7 is a view for describing the configuration of antennas in an electronic device according to various embodiments of the disclosure.
Figure 8:
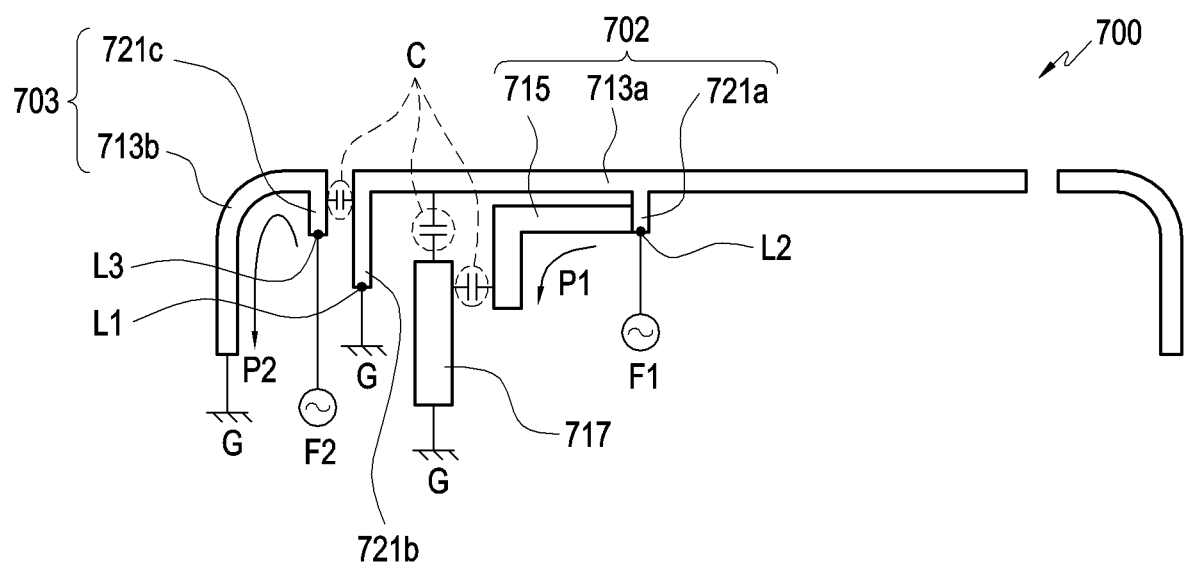
FIG. 8 is a view for describing the operations of the antennas illustrated in FIG. 7.

FIG. 7 is a view illustrating an arrangement of antennas 702 and 703 in an electronic device 700 according to various embodiments of the disclosure. FIG. 8 is a view illustrating the operations of the antennas 702 and 703 illustrated in FIG. 7.

Referring to FIGS. 7 and 8, the electronic device 700 (e.g., the electronic device 500 in FIG. 5) may include a first antenna 702 including a first conductive portion 713a made of a conductive material as a portion of a side bezel structure (e.g., the side bezel structure 510 in FIG. 5) and a first conductive pattern 715 and a second antenna 703 including a second conductive portion 713b made of a conductive material as another part of the side bezel structure. For example, the first conductive portion 713a and the first conductive pattern 715 may be included in the radiating conductor of the first antenna 702, and the second conductive portion 713a may be included in the radiating conductor of the second antenna 703. In an embodiment, the first conductive pattern 715 may be configured on the surface of a second support member (e.g., the second member 460 or 660 in FIG. 4 or FIG. 6) between the above-mentioned front and rear plates (e.g., the front and rear plates 420 and 480 in FIG. 4).

According to various embodiments, the first antenna 702 may include a first power-feeding pin 721a electrically connecting the first conductive portion 713a to a first power-feeding unit F1 (e.g., the communication module 190 of FIG. 1), and the first conductive pattern 715 may form a branched structure with the first power-feeding fin 721a. For example, the first conductive portion 713a and the first conductive pattern 715 are fed with common power via the first power-feeding unit F1, and the first antenna 702 may form operating frequencies in at least two different frequency bands using the first conductive portion 713a and the first conductive pattern 715. The first conductive portion 713a may include a first shorting pin 721b provided at one end thereof (e.g., a first position L1 adjacent to the second conductive portion 713b or the first insulating member 511a of FIG. 5), and when the first shorting pin 721b is connected the ground portion G, the first conductive portion 713a may form a PIFA structure. In some embodiments, the first power-feeding pin 721a or the first shorting pin 721b may be replaced by another structure such as a wire or a spring terminal that electrically connects the first conductive portion 713a to the first power-feeding unit F1 or the ground portion G.

According to various embodiments, the second antenna 703 may include a second power-feeding pin 721c, which electrically connects the second conductive portion 713b to the second power-feeding unit F2 (e.g., the communication module 190 in FIG. 1). For example, the second antenna 703 may include the second conductive portion 713b connected to the second power-feeding unit F2 via the second power-feeding pin 721c. In an embodiment, the second conductive portion 713b may be connected to the ground portion G by including a shorting pin (not illustrated) (e.g., the second shorting pin 521d in FIG. 5). According to another embodiment, one end of the second conductive portion 713b may be disposed adjacent to one end of the first conductive portion 713a, and the first conductive portion 713a and the second conductive portion 713b may form at least a portion of the exterior of the electronic device 700 (e.g., the electronic device 400 of FIG. 4).

According to various embodiments, when the second antenna 703 is disposed adjacent to the first conductive pattern 715, the electronic device 700 may further include a second conductive pattern 717. In an embodiment, the second conductive pattern 717 may be formed on the surface of a second support member (e.g., the second support member 660 in FIG. 6). When the second support member 660 is disposed the an inner space of the housing, for example, in the space surrounded by the side bezel structure 510 of FIG. 5, the second conductive pattern 717 may be disposed in the area or space between the first antenna 702 (e.g., the first conductive pattern 715) and the second antenna 703 to form and the second antenna 703 so as to form an electromagnetic field separation structure between the second antenna 703 and the first antenna 702 (e.g., the first conductive pattern 715), thereby improving a separation degree characteristic.

According to various embodiments, the second conductive pattern 717 may be electrically connected to the ground part G (e.g., the ground layer G in FIG. 5), and may provide an electromagnetic field separation structure by forming a capacitive coupling C with the first conductive portion 713a or the first conductive pattern 715. For example, a signal fed to the first conductive portion 713a or the first conductive pattern 715 via the first power-feeding unit F1 may form a radiating current P1 corresponding to the electrical length of the first conductive portion 713a or the first conductive pattern 715. In an embodiment, by the radiating current P1 formed in the first conductive pattern 715, the second conductive pattern 717 may form a capacitive coupling C with the first conductive portion 713a or the second conductive pattern 717. For example, at least the second conductive pattern 717 may be connected to the ground portion G so as to prevent the radiating current P1 of the first antenna 702 from interfering with the operation of the second antenna 703.

In an embodiment, the second power-feeding pin 721c may be configured on the second conductive portion 713b and located adjacent to the first shorting pin 721b of the first conductive portion 713a. The signal fed to the second antenna 703 via the second power-feeding portion F2 may form a radiating current P2 corresponding to the electrical length of the second conductive portion 713b. In an embodiment, when the second power-feeding pin 721c is located adjacent to the first shorting pin 721b, another capacitive coupling C may be formed between the second power-feeding pin 721c and the first shorting pin 721b. For example, at least the first shorting pin 721b may be connected to the ground part G so as to prevent the radiating current P2 of the second antenna 703 from interfering with the operation of the first antenna 702.

As described above, the second conductive pattern 717 or the first shorting pin 721b may be connected to the ground portion G between the first antenna 702 (e.g., the first conductive pattern 715) and the second antenna 703. For example, by the second conductive pattern 717 or the first shorting pin 721b, the first antenna 702 and the second antenna 703 are capable of conducting stable wireless communication without causing electromagnetic interference with each other.

Figure 9:
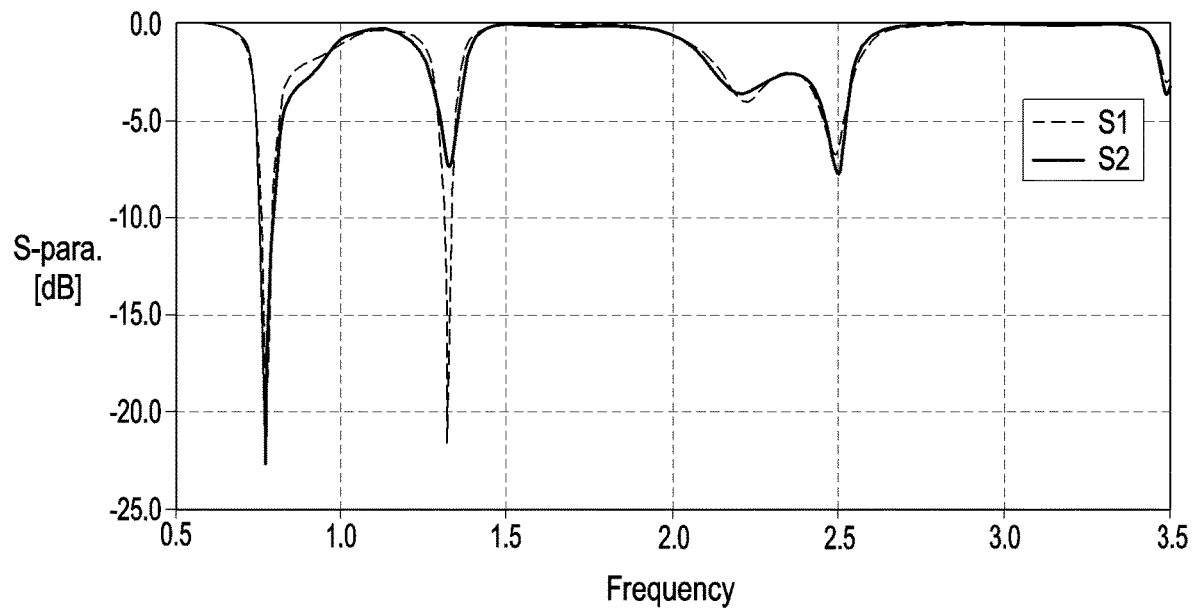
FIG. 9 is a view showing radiating characteristics measured before and after the second conductive pattern is disposed in the electronic device illustrated in FIG. 7.

FIG. 9 is a view showing radiating characteristics measured before and after the second conductive pattern 717 is disposed in the electronic device 700 illustrated in FIG. 7.

FIG. 9 is a graph showing a result of measuring a S-parameter, for example, a reflection coefficient S11 of an antenna (e.g., the antennas 702 and 703 in FIG. 7), in which "S1" represents a result of measuring the reflection coefficient of the first antenna 702 in the state in which the second conductive pattern 717 is disposed, and "S2" represents a result of measuring the reflection coefficient of the first antenna 702 in the state in which the second conductive pattern 717 is not disposed. As illustrated in FIG. 9, the reflection coefficient S11 may be adjusted by disposing the second conductive pattern 717, and it can be seen that wireless communication performance at one of the operating frequencies formed by the first antenna 702, for example, in at an about 1.2 GHz band is improved. In some embodiments, the second conductive pattern 717 may be so as to adjust impedance, and the conductive pattern 717 may provide an impedance matching function in the operating frequency band depending on the shape of the second conductive pattern 717 or the interval between the first conductive pattern 715 and the second conductive pattern 717.

According to various embodiments, in the structure in which the second antenna 703 and the first antenna 702 (e.g., the first conductive pattern 715) are disposed adjacent to each other, it can be seen that the first antenna 702 forms an operating frequency of about 1.2 GHz or 1.3 GHz, and that, by disposing the second conductive pattern 717, the reflection coefficient is improved by about 15 dB at an operating frequency of at least about 1.3 GHz. For example, the second antenna 703 and the first antenna 702 are capable of receiving position information based on GNSS signals including at least GPS signals in different frequency bands while being disposed adjacent to each other.

A change in radiation characteristics of the second antenna according to the arrangement of the first conductive pattern 715 and/or the second conductive pattern 717 will be described with reference to FIGS. 10 and 11.

Figure 10:
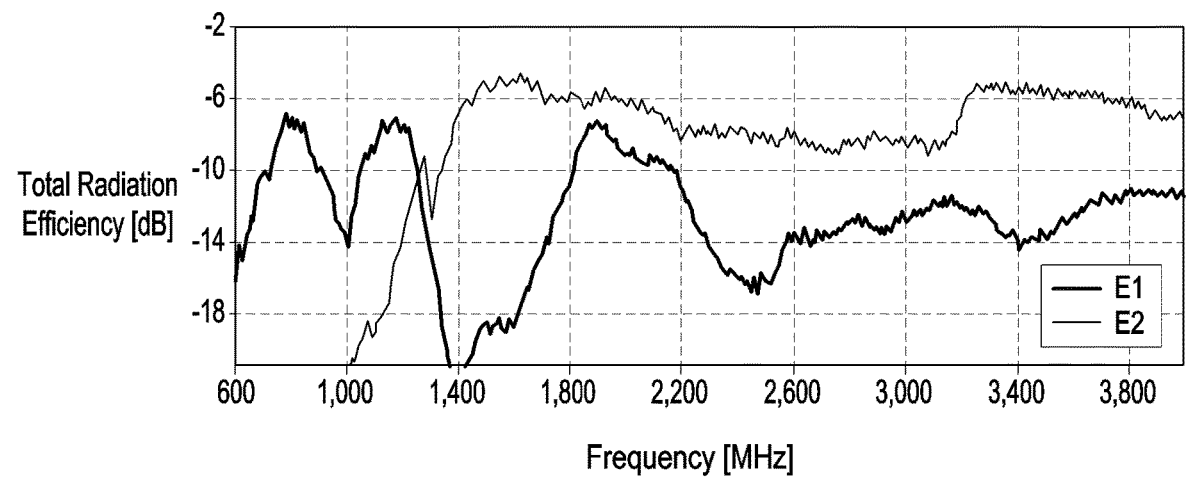
FIG. 10 is a view showing radiating efficiency of each of the first antenna and the second antenna measured in the electronic device illustrated in FIG. 7.

FIG. 10 is a view showing radiating efficiency of each of the first antenna 702 and the second antenna 703 measured in the electronic device 700 illustrated in FIG. 7.

In FIG. 10, "E1" represents a result of measuring the radiating efficiency of the first antenna 702, and "E2" represents a result of measuring the radiating efficiency of the second antenna 703. As illustrated in FIG. 10, it can be seen that the first antenna 702 forms an operating frequency in an about 800 MHz, 1.2 GHz, or 1.8 GHz band, and that the second antenna 703 forms an operating frequency in a frequency band of about 1.5 GHz or higher. For example, the operating frequency of about 1.5 GHz frequency band formed by the second antenna 703 and the operating frequency of the about 1.2 GHz frequency band formed by the first antenna 702 may be used as frequencies at which GNSS signals are received. For example, a processor or a communication module (e.g., the processor 120 or the communication module 190 in FIG. 1) may receive GNSS signals while conducting wireless communication using the second antenna 703 and at least the first antenna 702. As described above, when the first antenna 702 (e.g., the first conductive pattern 715) is disposed adjacent to the second antenna 703, electromagnetic interference is blocked between the first antenna 702 and the second antenna 703 by further disposing the second conductive pattern 717.

Figure 11:
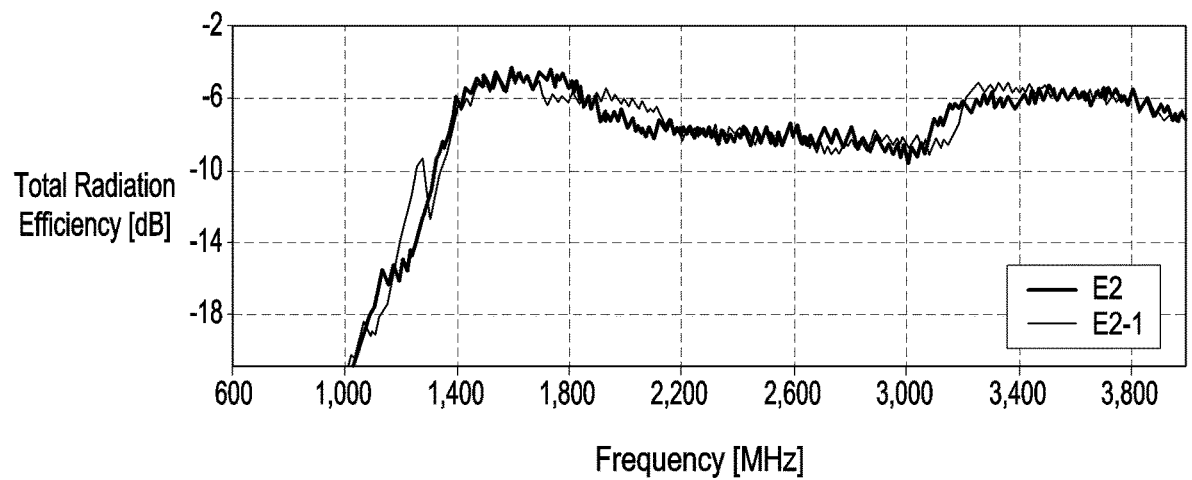
FIG. 11 is a view showing radiating efficiency of the second antenna measured before and after the second conductive pattern is disposed in the electronic device illustrated in FIG. 7.

FIG. 11 is a view illustrating the radiating efficiency of the second antenna 703 measured before and after disposing conductive patterns (e.g., the first conductive pattern 715 and the second conductive pattern 717) in the electronic device 700 illustrated in FIG. 7.

Since the difference between some of the operating frequencies formed by the first antenna 702 and some of the operating frequencies formed by the second antenna 703 is only several hundred MHz, when the first and second antennas are disposed adjacent to each other, electromagnetic interference may occur, and radiating efficiency may decrease. An antenna (e.g., the antenna 702 or 703 in FIG. 7) according to various embodiments of the disclosure or an electronic device including the same (e.g., the electronic device 700 in FIG. 7) may reduce the electromagnetic interference using the second conductive pattern 717 or the first shorting pin 721b disposed in the area or space between the second antenna 703 and the first conductive pattern 715. In an embodiment, the second conductive pattern 717 is electrically connected to a ground portion of the electronic device (e.g., the ground portion G in FIG. 7), and may at least partially form a capacitive coupling (e.g., the capacitive coupling C in FIG. 7) with the first conductive portion (e.g., the first conductive portion 713a in FIG. 7) of the side bezel structure (e.g., the side bezel structure 510 in FIG. 5) or the first conductive pattern 715. For example, the second conductive pattern 717 may be disposed between the second antenna 703 and the first antenna 702 (e.g., the first conductive pattern 715) so as to prevent the operating characteristics of the second antenna 703 from being distorted by the operation of the first antenna 702.

FIG. 11 shows the radiating efficiency of the second antenna 703 before and after the first conductive pattern 715 or the second conductive pattern 717 is disposed. In FIG. 11, "E2" represents a result of measuring the radiating efficiency of the second antenna 703 before disposing the conductive patterns (e.g., the first conductive pattern 715 and the second conductive pattern 717 in FIG. 7), in which the radiating efficiency may be substantially the same as the radiating efficiency of the second antenna 703 in FIG. 10. In FIG. 11, "E2-1" represents the result of measuring the radiating efficiency of the second antenna 703 in the state in which the first conductive pattern 715 and the second conductive pattern 717 are disposed. It can be seen that the second antenna 703 forms an operating frequency in an about 1.5 GHz frequency band, and that a change in the radiating efficiency of the second antenna 703 at the operating frequency according to whether or not the first conductive pattern 715 or the second conductive pattern 717 is disposed is insignificant. For example, by disposing the first conductive pattern 715, it is possible to additionally secure an operating frequency for receiving GNSS signals, and by disposing the second conductive pattern 717, the second antenna 703 is capable of conducting stable wireless communication.

As described above, an antenna (e.g., the antennas 502, 503, 702, or 703 of FIG. 5 or 7) according to various embodiments of the disclosure or an electronic device including the same is capable of securing an operation frequency in an additional frequency band (e.g., an about 1.2 GHz frequency band) by including the first conductive pattern 515 or 715. By further including the second conductive pattern 517 or 717, the antenna according to various embodiments of the disclosure is capable of maintaining or securing stable wireless communication performance of the second antenna 503 or 703 even when the first conductive pattern 515 or 7157 is disposed adjacent to the second antenna 503 or 703. The antenna according to various embodiments of the disclosure is capable of securing an additional operating frequency while substantially maintaining the size or mounting space of an electronic device. In some embodiments, a processor or a communication module of an electronic device is capable of improving the accuracy of position information by receiving at least GPS information using the second antenna 503 or 703 and the first conductive pattern 515 or 715.

Figure 12:
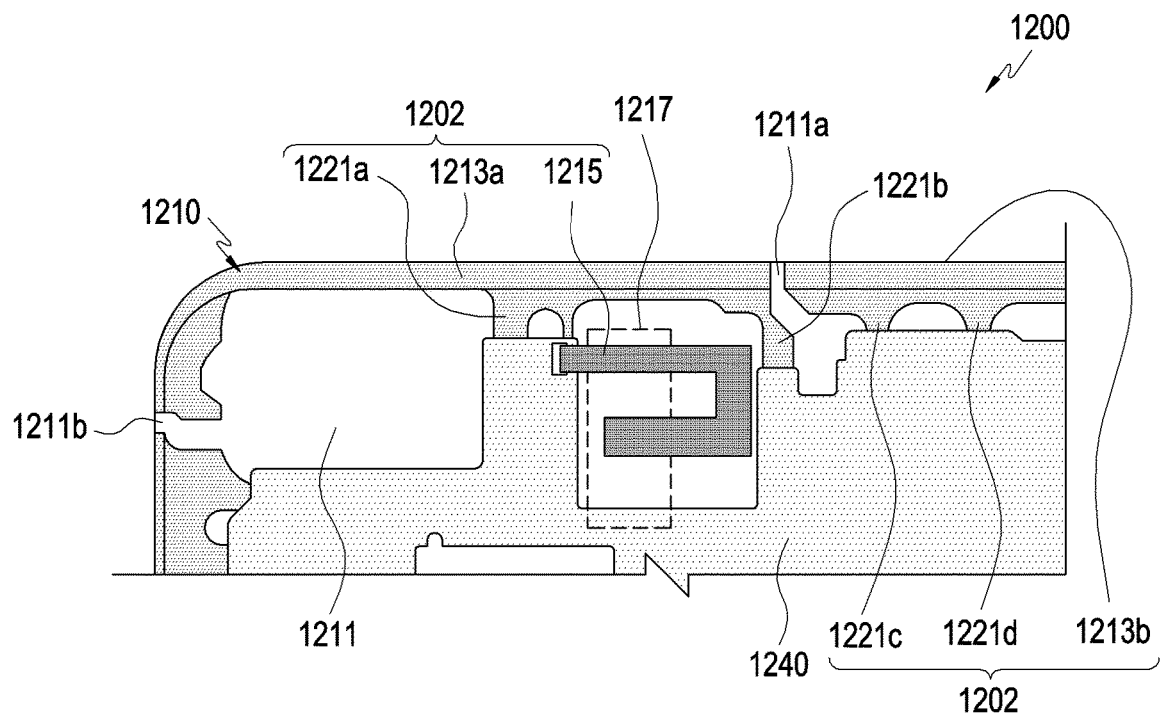
FIG. 12 is a view for describing a modification of an antenna arrangement in an electronic device according to various embodiments of the disclosure.
Figure 13:
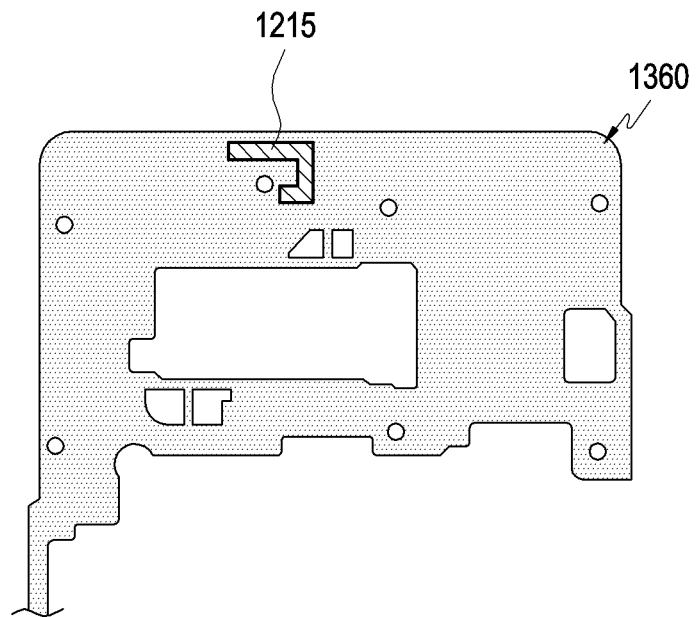
FIGS. 13 to 15 are view for describing a modification of conductive patterns in the electronic device according to various embodiments of the disclosure.
Figure 14:
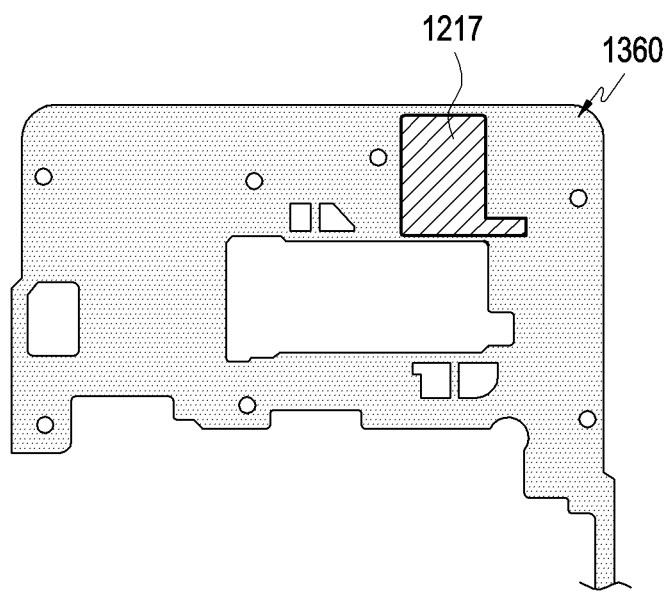
Figure 15:
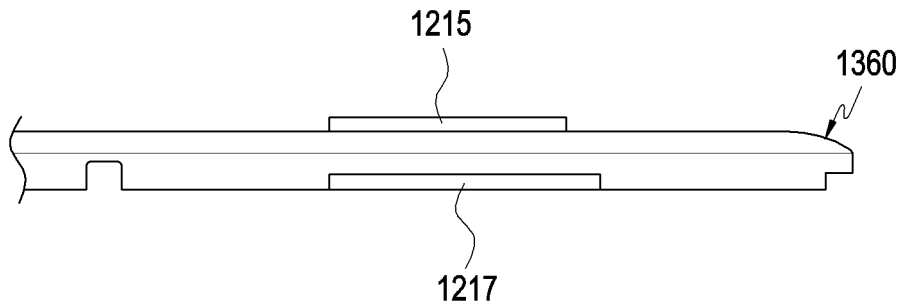

FIG. 12 is a plan view for describing a modification of an arrangement of antennas 1202 and 1203 in an electronic device 1200 (e.g., the electronic device 400) according to various embodiments of the disclosure. FIGS. 13 to 15 are views for describing a modification of conductive patterns 1215 and 1217 in the electronic device according to various embodiments of the disclosure.

Referring to FIGS. 12 to 15, the electronic device 1200 may include at least a portion of a side bezel structure 1210 (e.g., the side bezel structure 410 in FIG. 4) as antennas (e.g., a first antenna 1202 and a second antenna 1203). According to an embodiment, a side bezel structure 1210 and a first support member 1211 (e.g., the first support member 411 in FIG. 4) may be at least partially made of a non-conductive material, and the non-conductive material may be provided as insulating members 1211a and 1211b in the side bezel structure 1210.

According to various embodiments, among the conductive material portions of the side bezel structure 1210, a first conductive portion 1213a may be provided as a portion (e.g., a radiating conductor) of the first antenna 1202. In an embodiment, the second conductive portion 1213a may substantially form at least a portion of the exterior of the electronic device 1200. In an embodiment, the insulating members 1211a and 1211b may be disposed at opposite ends of the first conductive portion 1213a so as to provide an insulating structure between the first conductive portion 1213a and another conductive material portion of the side bezel structure (e.g., the second conductive portion 1213b). In another embodiment, the first conductive portion 1213a may include a first power-feeding pin 1221a and a first shorting pin 1221b extending from the inner surface thereof. The first power-feeding pin 1221a and the first shorting pin 1221b may protrude into the inner space of the housing.

According to various embodiments, the first antenna 1202 may include a first conductive pattern 1215. The first conductive pattern 1215 may include a printed circuit pattern configured on the second support member 1360 (e.g., the second support member 460 in FIG. 4). The first conductive pattern 1215 may include, for example, a conductive pattern formed by processing the surface of the second support member 1360 of a non-conductive material using a laser, i.e., through laser direct structuring (LDS). In an embodiment, the second support member 1360 may be disposed to face the circuit board 1240 (e.g., the printed circuit board 440 in FIG. 4), and it is noted that the second support member 1360 is omitted in FIG. 12 in order to show the positional relationship of the first conductive pattern.

According to various embodiments, the first conductive pattern 1215 may form an electrically branched structure with the first power-feeding pin 1221a. For example, the first conductive pattern 1215 may be electrically connected to the first conductive portion 1213a so as to form a portion of the first antenna 1202. In some embodiments, a contact member (not illustrated) (e.g., a C-clip) may be provided on the circuit board 1240 so as to electrically connect the first conductive pattern 1215 to the circuit board 1240. For example, a communication module (e.g., the communication module 190 in FIG. 1) may be disposed on the circuit board 1240 to be electrically connected to the first antenna 1202.

According to various embodiments, the first power-feeding pin 1221a and the first shorting pin 1221b may be electrically connected to the circuit board 1240 through another contact member (not illustrated). For example, the first power-feeding pin 1221a may be electrically connected to a first power-feeding unit (e.g., the first power-feeding unit F1 in FIG. 7) or a communication module (e.g., the communication module 190 in FIG. 1), and the first shorting pin 1221b may be electrically connected to a ground portion of the circuit board (e.g., the ground portion G in FIG. 7).

According to various embodiments, the first conductive portion 1213a may form a planar type inverted-F antenna (PIFA) structure, and the first conductive pattern 1215 may be implemented in various shape such as an L shape, a U shape, an I shape, or a meander line shape. The first conductive pattern 1215 is fed with power in common with the first conductive portion 1231a via the first power-feeding unit F1, and the first antenna 1202 may form operating frequencies in multiple different frequency bands using the first conductive portion 1213a and the first conductive pattern 1215. According to an embodiment, in the structure in which the first conductive pattern 1215 is not disposed, the first antenna 1202 may form an operating frequency in an about 800 MHz or 1.8 GHz band using the first conductive portion 1213a. In the structure in which the first conductive pattern 1215 is disposed, the first antenna 1202 may further form an operating frequency (e.g., 1.176 GHz) in an about 1.2 GHz band in addition to the operating frequency formed using the first conductive portion 1215.

According to various embodiments, the second conductive portion 1213b of the side bezel structure may be provided as the second antenna 1203 of the electronic device 1200 or as a portion of the second antenna 1203. In an embodiment, the second conductive portion 1213b may substantially form another portion of the exterior of the electronic device 1200. In another embodiment, one end of the second conductive portion 1213b may be positioned adjacent to one end of the first conductive portion 1213a, and a first insulating member 1211a may be disposed between the one end of the second conductive portion 1213b and the one end of the first conductive portion 1213a.

According to various embodiments, the second antenna 1203 may include a second power-feeding pin 1221c or a second shorting pin 1221d extending from the inner surface of the second conductive portion 1213b. The second power-feeding pin 1221c may protrude into the inner space of the housing. For example, the second power-feeding pin 1221c may be electrically connected to a second power-feeding unit (e.g., the second power-feeding unit F2 in FIG. 7), such as a communication module (e.g., the communication module 190 in FIG. 1), provided on the circuit board 1240 via another contact member (not illustrated). For example, the second antenna 1203 is fed with independent power independently from the first antenna 1202, and may form an operating frequency in a frequency band different from that of the first antenna 1202. For example, the second antenna 1203 may form an operating frequency (e.g., 1.575 GHz) in an about 2.3 GHz band or a 1.5 GHz band according to a fed signal. The processor or communication module of the electronic device may access a commercial communication network or receive GPS information using the second antenna 1203. In an embodiment, the second shorting pin 1221d may be electrically connected to a ground portion (e.g., the ground layer G in FIG. 5 or the ground portion G in FIG. 7) via a contact member (not illustrated).

According to various embodiments, a processor or a communication module (e.g., the processor 120 or the communication module 190 in FIG. 1) of an electronic device may transmit and receive a wireless signal using at least one of the first antenna 1202 and the second antenna 1203. According to an embodiment, the electronic device 1200 may receive position information (e.g., GPS information) using each of an operating frequency formed by the first conductive pattern 1215 and an operating frequency formed by the second antenna 1203. For example, an operating frequency of an about 1.2 GHz band or a 1.5 GHz band is a frequency band in which signals related to position information (e.g., GPS signals) are transmitted and received, and the electronic device 1200 may receive position information in multiple frequency bands. This makes it possible to improve the accuracy of position information in an electronic device including the electronic device 1200.

According to various embodiments, the electronic device 1200 may include a second conductive pattern 1217 connected to a ground portion provided in the housing (e.g., the ground portion G in FIG. 7). In an embodiment, the second conductive pattern 1217 may be formed by processing the surface of the second support member 1360 using a laser. In an embodiment, a dielectric material (e.g., a portion of the second support member 1360) may be disposed between the first conductive pattern 1215 and the second conductive pattern 1217. For example, as the second conductive pattern 1217, a structure formed on a surface different from that of the first conductive pattern 1215 on the second support member 1360 is illustrated.

According to various embodiments of the disclosure, when the second conductive pattern 1217 is formed on a surface different from the first conductive pattern 1215 on the second support member 1360, at least a portion of the first conductive pattern 1215 may be disposed to overlap a portion of the second conductive pattern 1217. Here, the first conductive pattern 1215 and the second conductive pattern 1217 are disposed on different surfaces of the second support member 1360, respectively. Thus, the wording "at least a portion of the first conductive pattern 1215 overlaps a portion of the second conductive pattern 1217" means that when viewed from one surface of the second support member 1360, at least a portion of the first conductive pattern 1215 overlaps a portion of the second conductive pattern 1217, with the second support member 1360 interposed therebetween. For example, one of the first conductive pattern 1215 and the second conductive pattern 1217 may be disposed closer to the front plate (e.g., the front plate 202 in FIG. 2) than the other, and may partially face the first plate, with the member 1360 interposed therebetween.

According to various embodiments, the second conductive pattern 1217 may form an electromagnetic isolation structure between the second antenna 1203 and the first antenna 1202 (e.g., the first conductive pattern 1215). For example, the second conductive pattern 1217 may reduce electromagnetic interference between the second antenna 1203 and the first conductive pattern 1215. There is a difference of about several hundred MHz between the operating frequency of the second antenna 1203 and the operating frequency of the first conductive pattern 1215. Thus, when the second antenna 1203 and the first conductive pattern 1215 are disposed adjacent to each other, transmission/reception efficiency may be lowered by electromagnetic interference. By including the second conductive pattern 1217, an antenna according to various embodiments of the disclosure or an electronic device including the same is capable of securing a stable wireless communication environment even when the second antenna 1203 and the first conductive pattern 1215 are disposed adjacent to each other. For example, by disposing the second conductive pattern 1217, the electronic device 1200 or an electronic device including the same is capable of being miniaturized while securing an operating frequency in an additional frequency band.

FIG. 16 is a block diagram illustrating an antenna system 1600 of an electronic device according to various embodiments of the disclosure.

Referring to FIG. 16, the antenna system 1600 may include a first antenna 1602, a second antenna 1603, a communication module (e.g., a first wireless communication circuit 1692a and/or a second wireless communication circuit 1692b). The communication module may be at least a portion of the communication module 190 of FIG. 1, and may be disposed on the printed circuit board 440 of FIG. 4. The first antenna 1602 and the second antenna 1603 may include, for example, a first antenna 502, 702, or 1202 and a second antenna 503, 703, or 1203 in FIG. 5, FIG. 7, or FIG. 12. For example, each of the first antenna 1602 and the second antenna 1603 may include a radiating conductor formed to include a portion of a side bezel structure (e.g., the side bezel structure 510 in FIG. 5) or a conductive pattern (e.g., the first conductive pattern 515, 715, or 1215 in FIG. 5, FIG. 7, or FIG. 12).

According to various embodiments, the first wireless communication circuit 1692a is configured to support, for example, cellular communication, and may transmit and receive a signal having a first frequency between about 600 MHz and about 2100 MHz using the first antenna 1602. For example, the first wireless communication circuit 1692a may transmit and receive a signal having an operating frequency of about 800 MHz or about 1.8 GHz via the first antenna 1602, and may include transceivers 1643a and 1643b corresponding to each operating frequency. In an embodiment, the first wireless communication circuit 1692a may include a switch circuit 1641 disposed between the first antenna 1602 and the transceivers 1643a and 1643b. In some embodiments, the first wireless communication circuit 1692a may transmit and receive a signal having a second frequency between about 1400 MHz and about 3000 MHz using the second antenna 1603. For example, the first wireless communication circuit 1692a may transmit and receive a signal having an operating frequency of about 2.3 GHz via the second antenna 1603, and may include another transceiver 1643c corresponding to the operating frequency.

According to various embodiments, the second wireless communication circuit 1692b may be configured to receive, for example, a GNSS signal. The GNSS signal may include, for example, a GPS signal. In an embodiment, the second wireless communication circuit 1692b may transmit and receive a signal having a third frequency between about 1100 MHz and about 1300 MHz using the first antenna 1602. For example, the second wireless communication circuit 1692b may receive a signal having an operating frequency of about 1200 MHz via the first antenna 1602. In another embodiment, the second wireless communication circuit 1692b may transmit and receive a signal having a fourth frequency between about 1500 MHz and about 1600 MHz using the first antenna 1603. For example, the second wireless communication circuit 1692b may receive a signal having an operating frequency of about 1500 MHz via the second antenna 1603.

According to various embodiments, transmission lines 1621 and 1631 may be provided between the first antenna 1602 and a communication module (e.g., the first wireless communication circuit 1692a and the second wireless communication circuit 1692b) or between the second antenna 1603 and the communication module. In an embodiment, between the first antenna 1602 and the first wireless communication circuit 1692a or between the second antenna 1603 and the first wireless communication circuit 1692a, the transmission lines 1621 and 1631 transmit cellular communication signals by providing extractors 1611a and 1611b, in which the GNSS signals received through the first antenna 1602 and the second antenna 1603 may be separated and transmitted to the second wireless communication circuit 1692b. In another embodiment, between the first antenna 1602 and the second wireless communication circuit 1692b or between the second antenna 1603 and the second wireless communication circuit 1692b, the transmission lines 1621 and 1631 may include the extractors 1611a and 1611b, low-noise amplifiers 1613a and 1613b, or filters 1615a and 1615b. For example, the GNSS signals received via the first antenna 1602 and the second antenna 1603 may be separated by the extractors 1611a and 1611b, and may be transmitted to the second wireless communication circuit 1692b via the low-noise amplifiers 1613a and 1613b or the filters 1615a and 1615b. The second wireless communication circuit 1692b may include a sensor hub or a software-defined radio (SDR) configured to receive and process a position information signal, such as a GNSS signal including a GPS signal.

According to various embodiments of the disclosure, an electronic device (e.g., the electronic device 200, 400, 500, 700, or 1200 in FIG. 2, FIG. 4, FIG. 5, FIG. 7, or FIG. 12) may include: a housing (e.g., the housing 210 in FIG. 2) including a front plate (e.g., the front plate 202 in FIG. 2), a rear plate (e.g., the rear plate 211 in FIG. 2), which faces away from the front plate, and a side bezel structure (e.g., the side bezel structure 218 or 510 in FIG. 2 or FIG. 5), which surrounds the space between the front plate and rear plate and includes a first conductive portion (e.g., the first conductive portion 513a or 713a in FIG. 5 or FIG. 7), a second conductive portion (e.g., the second conductive portion 513b or 713b in FIG. 5 or FIG. 7), and a first insulative portion (e.g., the first insulative portion 511a in FIG. 5), which is disposed between the first conductive portion and second conductive portion; a printed circuit board (e.g., the circuit board 440 or 450 in FIG. 4 or FIG. 5), which is disposed inside the housing and includes at least one ground layer (e.g., the ground layer G in FIG. 5 or the ground portion G in FIG. 7) electrically connected to a first position (e.g., the first position L1 or a position at which the first shorting pin 521b or 721b is provided in FIG. 5 or FIG. 7) of the first conductive portion adjacent to the first insulative portion; a first conductive pattern (e.g., the first conductive pattern 515 or 715 in FIG. 5 or FIG. 7), which is electrically connected to a second position (e.g., the second position L2 or the position at which the first power-feeding pin 521a or 721a is provided in FIG. 5 or FIG. 7) of the first conductive portion spaced further away from the first insulative portion than the first position and is disposed between the first position and the second position when viewed from an outside of the side bezel structure; a first wireless communication circuit, (e.g., the first wireless communication circuit 1692a in FIG. 16), which is electrically connected to the second position so as to transmit and receive a first signal having a first frequency and is electrically connected to a third position of the second conductive portion so as to transmit and receive a second signal having a second frequency; a second conductive pattern (e.g., the second conductive pattern 517 or 717 in FIG. 5 or FIG. 7), which is disposed between the second position and the third position when viewed from the outside of the side bezel structure and is electrically connected to the ground layer; and a second wireless communication circuit (e.g., the second wireless communication circuit 1692b in FIG. 16), which is electrically connected to the second position so as to receive a third signal having a third frequency and is electrically connected to the third position so as to receive a fourth signal having a fourth frequency.

According to various embodiments, the first frequency may include a frequency between about 600 MHz and about 2100 MHz, the second frequency may include a frequency between about 1400 MHz and about 3000 MHz, the third frequency may include a frequency between about 1100 MHz and about 1300 MHz, and the fourth frequency may include a frequency between about 1500 MHz and about 1600 MHz.

According to various embodiments, the first wireless communication circuit may be configured to support cellular communication, and the second wireless communication circuit may be configured to receive a global navigation satellite system (GNSS) signal.

According to various embodiments, the first wireless communication circuit and the second wireless communication circuit may be disposed on the printed circuit board.

According to various embodiments, when viewed from the outside of the side bezel structure, one of the first conductive pattern and the second conductive pattern may be disposed at a closer distance to the front plate, and when viewed from above the front plate, the first conductive pattern and the second conductive pattern may at least partially overlap each other.

According to various embodiments, the second conductive pattern may be configured to form a capacitive coupling (e.g., the capacitive coupling C in FIG. 8) with the first conductive portion or the first conductive pattern.

According to various embodiments, the third position may be located adjacent to the first insulative portion.

According to various embodiments, the electronic device described above may further include a support member (e.g., the support member 460 or 660 in FIG. 4 or FIG. 6) disposed between the front plate and the rear plate and is at least partially surrounded by the side bezel structure, and each of the first conductive pattern and the second conductive pattern may be disposed on the support member.

According to various embodiments, the second conductive pattern may be formed on the same surface as the first conductive pattern on the support member, and may be disposed in an area between the first conductive pattern and the second antenna.

According to various embodiments of the disclosure, an electronic device (e.g., the electronic device 100, 200, or 400 in FIG. 1, FIG. 2, or FIG. 4) may include: a housing (e.g., the housing 210 in FIG. 2) including a side bezel structure (e.g., the side bezel structure 410 or 510 in FIG. 4 or FIG. 5), which is at least partially formed of an electrically conductive material; a first antenna (e.g., the first antenna 502, 702, or 1202 in FIG. 5, FIG. 7, or FIG. 12) including a first conductive portion (e.g., the first conductive portion 513a, 713a, or 1213a of FIG. 5, FIG. 7, or FIG. 12), which is made of a conductive material in the side bezel structure, and a first conductive pattern (e.g., the first conductive pattern 515, 715, or 1215 of FIG. 5, FIG. 7, or FIG. 12), which is disposed in an inner space of the housing; a second antenna (e.g., the second antenna 503, 703, or 1203 in FIG. 5, FIG. 7, or FIG. 12) including a second conductive portion (e.g., the second conductive portion 513b, 713b, or 1213b in FIG. 5, FIG. 7, or FIG. 12), which is made of a conductive material in the side bezel structure; a second conductive pattern (e.g., the second conductive pattern 517, 717, or 1217 of FIG. 5, FIG. 7, or FIG. 12), which is disposed in the inner space of the housing and configured to forms a capacitive coupling (e.g., the capacitive coupling C in FIG. 7) with the first conductive portion or the first conductive pattern; and a processor or communication module (e.g., the processor 120 or the communication module 190 in FIG. 1), which is electrically connected to the first antenna and the second antenna. The processor or the communication module may be configured to receive at least global positioning system (GPS) information using at least one of the first antenna and the second antenna.

According to various embodiments, the electronic device may further include a ground portion (e.g., the ground portion G in FIG. 7), which is provided inside the housing, in which the second conductive pattern may be electrically connected to the ground portion.

According to various embodiments, the electronic device may further include: a front plate (e.g., the front plate 420 in FIG. 4), which is coupled to a front surface of the housing so as to form a first surface; a rear plate (e.g., the rear plate 480 in FIG. 4), which is coupled to a rear surface of the housing so as to form a second surface; and a support member (e.g., the second support member 460, 660, or 130 in FIG. 4, FIG. 6, or FIG. 13), which is made of a non-conductive material and is disposed between the front plate and the rear plate, in which at least one of the first conductive pattern and the second conductive pattern may be disposed on the support member.

According to various embodiments, the first conductive pattern and the second conductive pattern may be disposed on the same surface on the support member.

According to various embodiments, the first conductive pattern and the second conductive pattern may be disposed on different surfaces on the support member.

According to various embodiments, the second conductive pattern may be disposed in an area or a space between the first conductive pattern and the second antenna.

According to various embodiments, the electronic device may further include: a support member made of a non-conductive material and disposed in an inner space of the housing, wherein the second conductive pattern may be disposed on one surface of the support member, electrically connected to a ground portion of the electronic device and may be configured to form a capacitive coupling with the first conductive portion or the first conductive pattern.

According to various embodiments, the first conductive pattern may be disposed on one of opposite surfaces of the support member.

According to various embodiments, the second conductive pattern may be disposed in an area or a space between the first conductive pattern and the second antenna.

According to various embodiments, one end of the second conductive portion may be disposed adjacent to one end of the first conductive portion.

According to various embodiments, the electronic device may further include an insulating member interposed between the one end of the second conductive portion and the one end of the first conductive portion.

In the foregoing detailed description, specific embodiments of the disclosure have been described. However, it will be evident to a person ordinarily skilled in the art that various modifications may be made without departing from the scope of the disclosure.

For example, in describing the embodiments of the disclosure, it is described that the first shorting pin 521b, the second power-feeding pin 521c, or the like of FIG. 5 is disposed at the ends of the conductive portions 513a and 513b. However, the positions of the shorting pin, the power-feeding pin, or the like may vary depending on specifications required by an electronic device.

What is claimed is:
1. An electronic device comprising:
  a housing comprising a front plate, a rear plate facing away from the front plate, and a side bezel structure surrounding a space between the front plate and rear plate, and the side bezel structure comprising a first conductive portion, a second conductive portion, and a first insulative portion disposed between the first conductive portion and second conductive portion;
  a printed circuit board disposed inside the housing and comprising at least one ground layer electrically connected to a first position of the first conductive portion adjacent to the first insulative portion;
  a first conductive pattern electrically connected to a second position of the first conductive portion spaced further away from the first insulative portion than the first position and disposed between the first position and the second position when viewed from an outside of the side bezel structure;
  a first wireless communication circuit electrically connected to the second position so as to transmit and receive a first signal having a first frequency and electrically connected to a third position of the second conductive portion so as to transmit and receive a second signal having a second frequency;
  a second conductive pattern disposed between the second position and the third position when viewed from the outside of the side bezel structure and electrically connected to the ground layer; and a second wireless communication circuit electrically connected to the second position so as to receive a third signal having a third frequency and electrically connected to the third position so as to receive a fourth signal having a fourth frequency.

2. The electronic device of claim 1, wherein the first frequency comprises a frequency between about 600 MHz and about 2100 MHz, the second frequency comprises a frequency between about 1400 MHz and about 3000 MHz, the third frequency comprises a frequency between about 1100 MHz and about 1300 MHz, and the fourth frequency comprises a frequency between about 1500 MHz and about 1600 MHz.

3. The electronic device of claim 1, wherein, when viewed from the outside of the side bezel structure, one of the first conductive pattern and the second conductive pattern is disposed at a closer distance to the front plate, and
when viewed from above the front plate, the first conductive pattern and the second conductive pattern at least partially overlap each other.

4. The electronic device of claim 1, wherein the second conductive pattern is configured to form a capacitive coupling with the first conductive portion or the first conductive pattern.

5. The electronic device of claim 1, wherein the third position is located adjacent to the first insulative portion.

6. The electronic device of claim 1, further comprising:
a support member disposed between the front plate and the rear plate and at least partially surrounded by the side bezel structure,
wherein each of the first conductive pattern and the second conductive pattern is disposed on the support member.

7. An electronic device comprising:
a housing comprising a side bezel structure at least partially formed of an electrically conductive material;
a first antenna comprising a first conductive portion made of a conductive material in the side bezel structure, and a first conductive pattern disposed in an inner space of the housing;
a second antenna comprising a second conductive portion made of a conductive material in the side bezel structure;
a second conductive pattern disposed in the inner space of the housing and configured to form a capacitive coupling with the first conductive portion or the first conductive pattern; and
a processor or communication module electrically connected to the first antenna and the second antenna,
wherein the processor or the communication module is/are configured to receive at least global positioning system (GPS) information using at least one of the first antenna and the second antenna.

8. The electronic device of claim 7, further comprising:
a ground portion provided inside the housing,
wherein the second conductive pattern is electrically connected to the ground portion.

9. The electronic device of claim 8, further comprising:
a front plate coupled to a front surface of the housing so as to form a first surface;
a rear plate coupled to a rear surface of the housing so as to form a second surface; and
a support member made of a non-conductive material and disposed between the front plate and the rear plate,
wherein at least one of the first conductive pattern and the second conductive pattern is disposed on the support member.

10. The electronic device of claim 9, wherein the first conductive pattern and the second conductive pattern are disposed on a same surface on the support member.

11. The electronic device of claim 9, wherein the first conductive pattern and the second conductive pattern are disposed on different surfaces on the support member.

12. The electronic device of claim 8, wherein the second conductive pattern is disposed in an area or a space between the first conductive pattern and the second antenna.

13. The electronic device of claim 7, further comprising:
a support member made of a non-conductive material and disposed in an inner space of the housing,
wherein the second conductive pattern is disposed on one surface of the support member, electrically connected to a ground portion of the electronic device, and configured to form a capacitive coupling with the first conductive portion or the first conductive pattern.

14. The electronic device of claim 7, wherein one end of the second conductive portion is disposed adjacent to one end of the first conductive portion.

15. The electronic device of claim 14, further comprising:
an insulating member interposed between the one end of the second conductive portion and the one end of the first conductive portion.

* * * * *